(12) United States Patent
Rymer et al.

(10) Patent No.: US 7,250,220 B1
(45) Date of Patent: Jul. 31, 2007

(54) BOND STRENGTH OF COATINGS TO CERAMIC COMPONENTS

(75) Inventors: Joseph Patrick Rymer, Livermore, CA (US); Rafael Ricolcol, Freemont, CA (US)

(73) Assignee: Tosoh SET, Inc., Dublin, CA (US)

( * ) Notice: Subject to any disclaimer, the term of this patent is extended or adjusted under 35 U.S.C. 154(b) by 552 days.

(21) Appl. No.: 10/639,969

(22) Filed: Aug. 12, 2003

Related U.S. Application Data

(60) Provisional application No. 60/415,915, filed on Oct. 3, 2002.

(51) Int. Cl.
*B32B 15/00* (2006.01)
*C23C 16/00* (2006.01)

(52) U.S. Cl. ..................... 428/469; 427/252

(58) Field of Classification Search .............. 428/469, 428/701, 702, 699, 697; 118/33, 718, 726, 118/723
See application file for complete search history.

(56) References Cited

U.S. PATENT DOCUMENTS

| | | | |
|---|---|---|---|
| 5,202,008 A | | 4/1993 | Talieh et al. |
| 5,391,275 A | | 2/1995 | Mintz |
| 6,087,285 A | * | 7/2000 | Oomichi et al. ............ 501/103 |
| 6,330,801 B1 | | 12/2001 | Whelan et al. |
| 6,368,410 B1 | | 4/2002 | Gorczyca et al. |
| 6,406,598 B2 | | 6/2002 | Lee et al. |
| 6,428,663 B1 | | 8/2002 | Mostovoy et al. |
| 6,472,014 B1 | | 10/2002 | Matsuba |
| 6,517,908 B1 | | 2/2003 | Thom |
| 6,534,197 B2 | * | 3/2003 | Noda et al. ................ 428/689 |
| 2002/0018921 A1 | * | 2/2002 | Yamada et al. ............. 428/697 |
| 2002/0038690 A1 | | 4/2002 | Minato et al. |
| 2004/0067392 A1 | * | 4/2004 | Yamada et al. ............. 428/702 |

FOREIGN PATENT DOCUMENTS

| | | | |
|---|---|---|---|
| JP | 60-223653 | * | 11/1985 |
| JP | 63-277061 | * | 11/1988 |

OTHER PUBLICATIONS www.m-w.com/dictionary/metallic (Merrium-Webster Online Dictionary).*
Metals Handbook Desk Edition Online; ASM, 2002.
(Continued)

*Primary Examiner*—Jennifer C. McNeil
*Assistant Examiner*—Gordon R. Baldwin
(74) *Attorney, Agent, or Firm*—Phelps Dunbar LLP; Harvey S. Kauget

(57) ABSTRACT

An improved component for use in a deposition chamber is constructed from ceramic zirconia and a stabilizing compound. The zirconia is preferably in a partially stabilized form and is coated with a metallic layer such as thermally sprayed aluminum. The surface of the zirconia is roughened to improve adhesion between the zirconia and the aluminum. Alternatively, an intermediate layer may be deposed between the zirconia and the metallic layer to improve the bonding between the layers. The coated zirconia component resists flaking when covered with materials that are being deposited in the deposition chamber and, thus, reduces the likelihood that devices being constructed in the deposition chamber will be contaminated by loose particles.

16 Claims, 2 Drawing Sheets

OTHER PUBLICATIONS

I. Birkby and R. Stevens; Applications of Zirconia Ceramics; Key Engineering Materials vols. 122-124 (1996) pp. 527-552.

Reed W. Rosenberg, Pentagon Technologies; Micromagazine.com; Increasing PVD tool Uptime and Particle Control with Twin-Wire-Arc Spray Coatings.

Frances Markel, Matthew Simpson, OH-Hun Kwon & Marc Abouaf; Saint-Gobain Industrial Ceramics, Inc.; Semiconductor Fabtec -Developments in Ceramics for Semiconductor Processing.

* cited by examiner

BOND STRENGTH OF COATINGS TO CERAMIC COMPONENTS

CROSS REFERENCES TO RELATED APPLICATIONS

This application claims priority from and is related to commonly owned U.S. Provisional Patent Application Ser. No. 60/415,915, filed Oct. 3, 2002, entitled: Improved Bond Strength of Coatings to Ceramic Components, this Provisional Patent Application incorporated by reference herein.

FIELD OF THE INVENTION

The present invention relates generally to the field of semiconductor processing. More specifically, the present invention relates to extending the useful service life of certain components for use in deposition equipment by constructing the components from a combination of a ceramic material (zirconia) and a metal coating layer.

DESCRIPTION OF THE BACKGROUND ART

Figure 1:
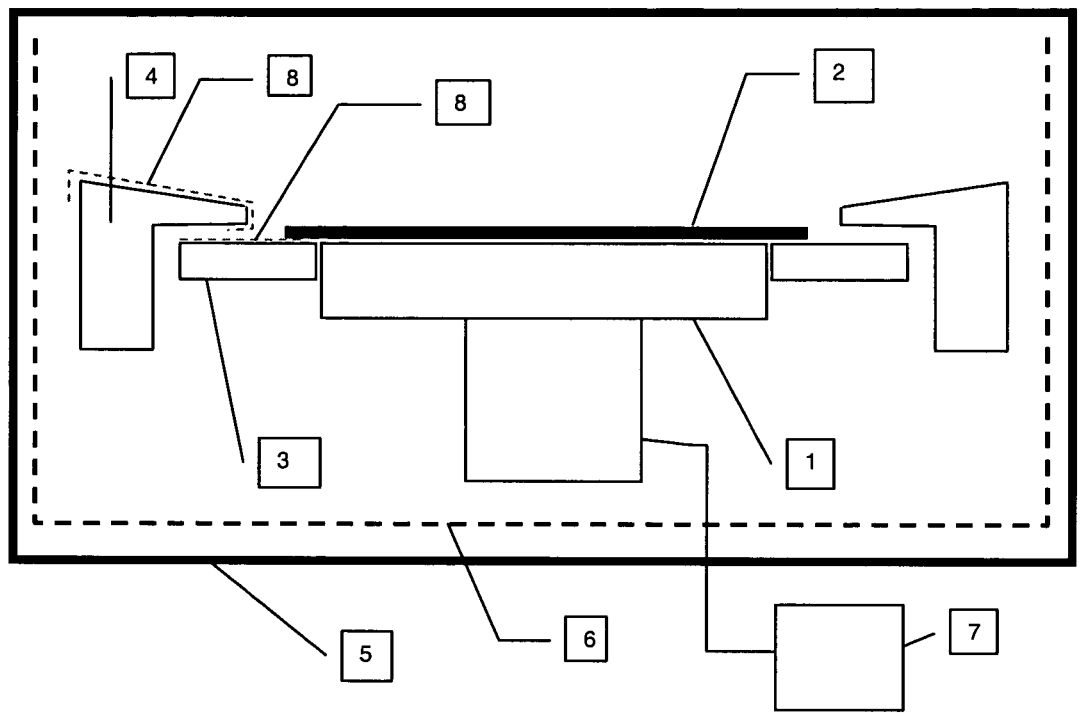

In thin-film deposition systems used for semiconductor manufacturing, a wafer 2, as shown in FIG. 1, is generally held during processing on a pedestal or holder 1 that is situated in a vacuum chamber 5. Material emitted from a deposition source (not illustrated) deposits a thin film on the exposed side of the wafer (which is the intended purpose of the system). However, during the deposition process, some of the emitted material unavoidably is deposited on the surface of components located within the deposition chamber. For example, deposition material 8 is deposited on rings 3 and 4, or shield 6, as shown in FIG. 1. These components 3, 4 and 6 are often designed to be replaced when the accumulated deposited material 8 becomes so thick that it begins to flake off the components and contaminate the deposition process.

In general, due to the properties of the material that is deposited and the deposition conditions, the layers of material deposited on the wafer and on the surface of the components located within the deposition chamber will be in a state of intrinsic mechanical stress. The level of intrinsic mechanical stress depends upon many factors including the particular materials deposited and the relevant deposition process conditions.

In most practical deposition systems, a large number of wafers are processed in sequence. For example, a first wafer is placed in the chamber by a means that maintains the chamber under vacuum conditions. Then, a thin film of material is deposited on the wafer. At the same time, a thin layer of the deposition material is unavoidably deposited on the surface of the components located within the chamber. After deposition on the first wafer is complete, the wafer is removed from the deposition chamber by a mechanism that maintains the chamber under vacuum conditions. Then, a second wafer is placed in the chamber (again by a mechanism that maintains the chamber under vacuum conditions). A thin film of material is deposited on the second wafer, and similarly, another layer of the deposition material is deposited on the surface of the components located within the chamber. This sequence is repeated for many wafers.

During the deposition time for each wafer, an additional thin layer of material 8 is deposited on the surface of the components located within the chamber (for example components 3, 4, and 6) thereby allowing the total accumulated thickness of deposited material on these components to be much thicker than any individual layer deposited on any individual wafer. Unfortunately, the intrinsic stress of the deposited material acts in a way that tends to cause the accumulation of deposited material to pull away from the underlying surface of the components. This tendency to pull away from the surface of the components increases as the total thickness of the accumulated deposited material increases. Whereas, the tendency of the material to pull away from the surface of the components is opposed by the adhesion, if any, between the deposited material and the surface of the components.

It is generally undesirable for the accumulated deposition material 8 to pull away or debond from the surface of the component. If this happens, small particles are created, generally by microscopic or macroscopic fracturing of the accumulated layers of deposited material. If any of these small particles are transferred to the wafers being processed, permanent defects can result in the integrated circuits created on the wafers. In addition, if the particles are large enough, they may interfere with other necessary operations of the chamber components. For example, if the pedestal 1 includes an electrostatic clamp, the clamping action of the electrostatic clamp may be inhibited by the presence of particles between the wafer and the clamp. Once such particle generation has begun from some components located in the chamber, it may be irreversible. As a result, the chamber may have to be opened and cleaned, and various components replaced, in order to restore acceptable processing performance.

Opening of the chamber exposes the interior surfaces of the chamber to the ambient atmosphere. One effect of opening the chamber is that valuable production time is lost since restoring an acceptable vacuum level in the chamber after it has been opened can often require from 6 to 24 hours. Pre-mature opening of the chamber may also force premature replacement of other components which may be quite costly (for example, a partially used sputter target).

In order to process as many wafers as possible between chamber openings, various surface treatments have been applied, in the past, to components such as 3, 4, and 6. It is well known to those skilled in the art that treatments providing a rough surface finish on the components inside the chamber that accumulate deposited material can improve the adhesion of the deposited material to the surface of the components. Such adhesion tends to counteract the tendency of the intrinsic stress of the deposited material which causes the deposited material to pull away from the surface of the component in fractured pieces.

Surface treatment methods such as abrasive grit blasting, bead blasting, arc-spraying, and plasma spraying have all been used in the past for the purpose of providing enhanced surface roughness to improve the adhesion of the deposited film to the treated surfaces of the components inside the chamber. Surface treatment methods such as abrasive blasting or bead-blasting directly roughen the surface material of the component. Methods such as arc-spraying or plasma-spraying add a layer of coating material to the component. In these cases the exposed surface of the coating forms the roughened surface of the finished component.

In many applications, the basic shapes for components such as 3, 4, 6 may be constructed of metal materials. In such cases, the conventional surface roughening treatments usually provide improved performance up to the point at which the deposited material becomes thick enough to finally fracture in spite of the improved adhesion to the surface of the component inside the chamber. However, in some recent applications, components such as 3, 4, and 6 can not be wholly constructed of metal materials due to the unsuitability of the metal's material properties in regard to some other requirements of the processing chamber. For example, if a radio frequency (RF) bias is applied to the pedestal 1 by RF system 7, components near the wafer such as 3 and 4 may be required to have relatively low electrical conductivity on at least part of their surface in order for the deposition process to function correctly.

A common non-conducting material used for such sensitive applications discussed above is aluminum oxide ceramic (alumina). This ceramic material has properties desirable for use in a deposition chamber such as high electrical resistivity, mechanical stiffness and strength, good vacuum properties, ability to be fabricated with accurate dimensional tolerances, etc. However, surface treatments intended to increase surface roughness are more difficult with this hard ceramic material. Thus, abrasive blasting or bead-blasting cannot produce sufficient surface roughness on an alumina component to enhance the adhesion of typical deposited materials to a useful point. Arc-sprayed application of an aluminum coating to the surface of an alumina component that will accumulate deposited material has been successful in some applications. For example, in FIG. 1, the bulk of a component 4 may be conventionally fabricated from alumina ceramic, then coated with a coating 8, which may be aluminum. In these instances, the deposited film adheres well to the arc-sprayed aluminum coating which has a very rough surface.

In some applications, however, a new failure mode appears. In this failure mode, the intrinsic stress in the accumulated deposited material overcomes the adhesion between the arc-sprayed aluminum coating and the surface of the alumina component inside the chamber. Thus, the coating 8 may physically be delaminated from the bulk of the component 4 even though the adhesion of the deposited material to the arc-sprayed aluminum is still sufficient at this point. Unacceptable particle generation will still occur in this case as the combination of the deposited material and the aluminum coating deforms and fractures. Thus, the primary failure mode becomes separation of the aluminum coating from the alumina substrate of the component.

Therefore, what is needed is a method of improving the adhesion between the aluminum coating and the bulk of the component that will substantially extend the number of wafers that can be processed between successive openings of the deposition chamber. Such a method would provide a significant economic advantage over prior art methods and apparatus.

SUMMARY OF THE INVENTION

A preferred embodiment of the present invention utilizes the combination of a ceramic material satisfying the necessary performance requirements for use in a processing chamber and an arc-sprayed aluminum coating to overcome the deficiencies of the prior art. The ceramic material of the present invention provides similar structural function to the prior art use of alumina, while the aluminum arc-sprayed coating provides good adhesion to the deposited material. In preferred embodiments of the current invention, the use of a different ceramic material to form the components in the vacuum chamber provides greatly improved adhesion between the arc-sprayed aluminum coating and the rest of the component.

One embodiment of the present invention is directed toward a method for coating components used within a vacuum deposition chamber to increase adhesion of deposited material to the components. In accordance with the method, zirconia is used to fabricate the components for the vacuum deposition chamber. The zirconia is preferably in a partially stabilized form prior to fabricating the zirconia into components. The fabricated zirconia component is then coated (wholly or partly) with a metallic layer having a high surface roughness. Most preferably, the fabricated zirconia component is coated with thermally sprayed aluminum. However, the metallic layer may also be constructed from titanium, stainless steel, molybdenum, tantalum, or other metals having a high surface roughness. The surface of the zirconia is preferably roughened prior to depositing the metallic layer to improve adhesion between the thermally sprayed aluminum layer and the bulk zirconia component. Alternatively, an intermediate layer may be deposited between the metallic layer and the fabricated zirconia component to further improve adhesion between the layers.

Another embodiment of the present invention is directed toward a component for use in a deposition process. The component is constructed from zirconia in the partially stabilized or tetragonal polycrystalline form. A metallic layer of thermally sprayed aluminum is deposited over at least a portion of the zirconia component. An intermediate layer may be deposited between the zirconia component and the metallic layer.

The above described embodiments offer a number of improvements over the prior art. The primary advantage is that deposition products from the deposition process tend to adhere to the metal coated zirconia components. This substantially prevents the deposition products from flaking off of the components and contaminating the structures being constructed in the deposition chamber. Due to the better adhesion between the coating and the component, a greater amount of deposition products can accumulate without causing the coating to debond from the component. In addition, the reduced need to replace the components and clean the deposition chamber reduces the down time of the deposition chamber and, thus, increases the productivity of the chamber. Therefore, the above discussed embodiments represent a substantial improvement upon the prior art.

DETAILED DESCRIPTION OF THE PREFERRED EMBODIMENTS

The present inventors have discovered that zirconia ceramics have particularly desirable properties with regard to the adhesion of metal coatings to the zirconia ceramic. In particular, the improved adhesion of metal coatings on zirconia components provides the advantage of longer useable component life for coated components utilized in plasma deposition chambers.

Zirconia (zirconium oxide) ceramics include partially stabilized zirconia (PSZ) which can be made by adding a stabilizing compound to zirconia such as MgO, $Y_2O_3$, CaO, etc. Zirconia ceramics also include the tetragonal zirconia polycrystal (TZP) form which is stabilized by adding a compound such as $Y_2O_3$ or $CeO_2$. Zirconia ceramics are described in Birkby and Stevens, "Applications of Zirconia Ceramics", Key Engineering Materials Vols. 122-124 (1996) pp. 527-552. The disclosure of which is hereby incorporated into the present application by reference.

Figure 2:
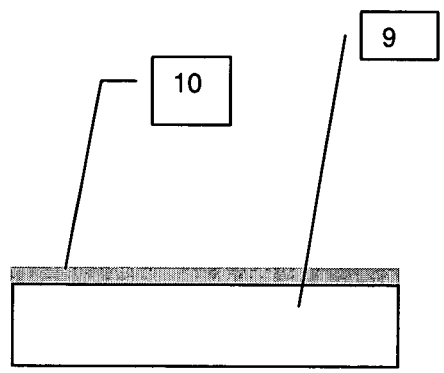

Referring now to FIG. 2, a preferred embodiment of the present invention is directed toward a PSZ zirconia ceramic component 9 that is fully or partially coated with an aluminum coating 10, which coating has a high surface roughness, for use in a physical vapor deposition (PVD) chamber. A preferred coating method utilizes a thermal spraying process in which aluminum metal is melted and the molten droplets are propelled at high velocity by a gas stream toward the surface being coated. Thermal spraying allows complex shapes to be coated, and also allows certain areas to be masked if coating is desired only on selected parts of the component. Thermal sprayed coatings tend to have a high surface roughness, which is a known advantage in PVD deposition chambers. In addition, the ductile aluminum coating may plastically deform, thus relieving some of the stress in the accumulated deposited material.

A particularly preferred thermal spraying method utilizes twin-wire arc spraying in which an electric arc is struck between the ends of two wires made of the coating material. A gas stream directed through the arc carries droplets of metal melted by the arc toward the surface to be coated. For example, adhesion testing by the tensile pull test method (ASTM C633) has shown that arc-sprayed aluminum coatings on zirconia substrates have an adhesion strength of approximately 12,500 psi. Similar aluminum coatings on alumina substrates demonstrate adhesion strengths of only 2000 to 5000 psi. Thus, the adhesion strength of the arc-sprayed aluminum to the zirconia material is markedly improved.

The improved adhesion of aluminum applied on zirconia by twin-wire arc spraying is particularly surprising since it is much more difficult to roughen a zirconia surface than an alumina surface. It is well-known to those skilled in the art that adhesion of metal coatings to ceramic substrates is improved by first roughening the substrate surface (for example, by grit-blasting). Roughening the substrate surface allows more mechanical interlocking of the subsequently applied coating with the irregularities of the rough substrate. Such interlocking increases the adhesion between coating and substrate.

Due to differences in mechanical properties between zirconia and alumina, however, an equivalent roughening procedure creates a smoother surface on a zirconia substrate than on an alumina one. For example, the average surface roughness of one set of alumina samples was 206 microinches after grit-blasting, while the average surface roughness of zirconia samples prepared by the same technique was only 163 microinches. In spite of the smoother surface the adhesion of the aluminum coating was much higher to the zirconia substrate as noted above.

Other thermal spraying methods may be used to apply the aluminum coating to the zirconia component. These methods include plasma spraying, high velocity oxy-fuel spraying and flame spraying. Thermal spraying methods are described in "Metals Handbook Desk Edition Online", ASM, 2002, the disclosure of which is hereby incorporated into the present application by reference. If desired, the surface of the zirconia substrate may be roughened and/or cleaned before application of the aluminum coating.

Figure 3:
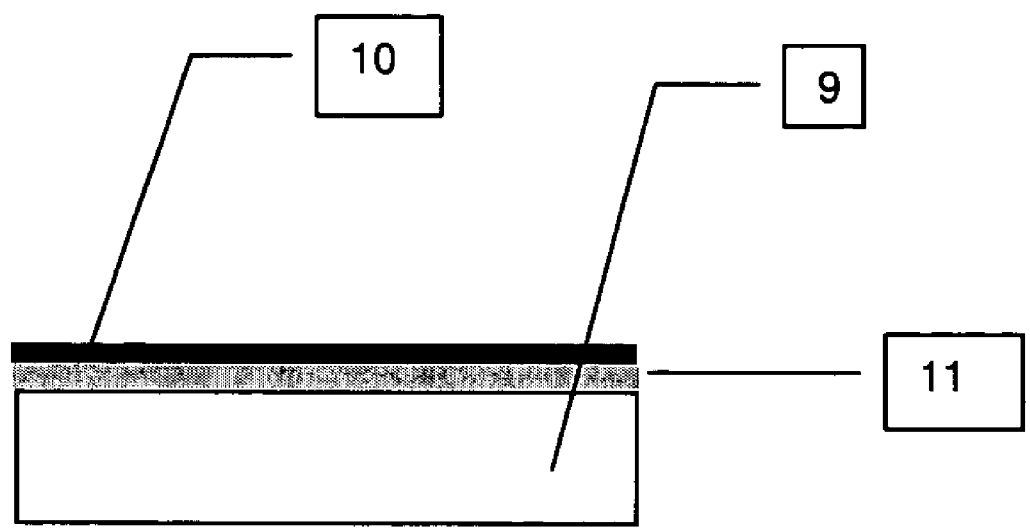

The above described invention is subject to a number of variations. In one such embodiment of the present invention, a TZP zirconia ceramic component is coated with an aluminum coating by thermal spraying as described above. In another embodiment, the metal coating is not aluminum, but another metal with properties desirable for the growth of the accumulating deposition material. Such metals may include titanium, stainless steel, molybdenum, tantalum, and alloys thereof. In addition, methods other than thermal spraying may be used to deposit the metallic coating. The particular deposition method used will depend upon the particular material being deposited and the process conditions. In addition, one or more intermediate layers 11 may be interposed between the zirconia component 9 and the outermost coating 10 as shown in FIG. 3.

In a preferred embodiment of the invention, the zirconia components coated with aluminum are used as components in a physical vapor deposition (PVD) chamber. Materials that are commonly deposited in such chambers include tantalum, tantalum nitride, titanium, titanium nitride, copper, aluminum and others. Especially when tantalum or tantalum nitride materials are deposited, the accumulating deposited material has enough intrinsic stress that the coating layers 8 (typically applied by thermal spraying) on conventional alumina components 3 and 4 disposed around the wafer tend to de-bond before other components in the chamber have reached their useful life. The improved adhesion between the aluminum coating and the zirconia components provided by the present invention allows much longer operation of the components and, thus, offers significant economic advantages over prior methods.

In addition to the above discussed features, the present invention disclosure also includes the subject matter contained in the appended claims. Although this invention has been described in its preferred form with a certain degree of particularity, it is understood that the present disclosure of the preferred form has been made only by way of example and that numerous changes in the details of construction and the combination and arrangement of features may be resorted to without departing from the spirit and scope of the invention.

What is claimed is:

1. A method for coating components used within a vacuum deposition chamber to increase adhesion of deposited materials to the components, said method comprising:
   fabricating zirconia into components for the vacuum deposition chamber; and
   coating the fabricated zirconia components with a metal layer having a high surface roughness.

2. The method of claim 1 wherein the step of coating the fabricated zirconia components with a metal layer having a high surface roughness further comprises coating the fabricated components by thermally spraying aluminum on the fabricated component.

3. The method of claim 1 wherein the step of coating the fabricated zirconia components with a metal layer having a high surface roughness further comprises coating the fabricated zirconia components with a metal layer of titanium, stainless steel, molybdenum or tantalum having a high surface roughness.

4. The method of claim 1 further comprising the step of depositing an intermediate layer between said metal layer and said fabricated zirconia component.

5. The method of claim 1 further comprising the step of roughening the surface of the zirconia component prior to depositing the metal layer.

6. The method of claim 1 further comprising the step of adding a stabilizing compound to the zirconia to form partially stabilized zirconia prior to fabricating the zirconia into a component.

7. The method of claim 1 wherein said zirconia is in a tetragonal zirconia polycrystalline form.

8. A deposition chamber comprising:
   a plurality of components;
   at least one of said components comprising zirconia, said zirconia component having a metal layer deposited by thermal spraying over at least a portion of an exposed surface of said zirconia component.

9. The component of claim 8 wherein the exposed surface of the zirconia component is roughened prior to deposition of said metal layer.

10. The component of claim 8 wherein said metal layer is selected from the group consisting of aluminum, titanium, tantalum, stainless steel, molybdenum and alloys thereof.

11. The component of claim 8 further comprising an intermediate layer deposited by thermal spraying between said zirconia component and said metal layer.

12. The component of claim 8 wherein said zirconia is in a tetragonal zirconia polycrystalline form.

13. The component of claim 12 wherein said zirconia further comprises a stabilizing compound.

14. The component of claim 13 wherein said stabilizing compound is selected from the group consisting of $Y_2O_3$ and $CeO_2$.

15. The component of claim 8 wherein said zirconia further comprises a stabilizing compound.

16. The component of claim 15 wherein said stabilizing compound is selected from the group consisting of MgO, $Y_2O_3$, and CaO.

* * * * *